(12) United States Patent
Huang

(10) Patent No.: US 9,837,737 B1
(45) Date of Patent: Dec. 5, 2017

(54) ELECTRICAL CONNECTOR

(71) Applicant: LOTES CO., LTD, Keelung (TW)

(72) Inventor: Chang Wei Huang, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/435,753

(22) Filed: Feb. 17, 2017

(30) Foreign Application Priority Data

Oct. 28, 2016 (CN) .................... 2016 2 1184486 U

(51) Int. Cl.
| | |
|---|---|
| *H01R 12/70* | (2011.01) |
| *H01R 4/02* | (2006.01) |
| *H05K 1/11* | (2006.01) |
| *H01R 13/6585* | (2011.01) |
| *H01R 13/24* | (2006.01) |

(52) U.S. Cl.
CPC ......... *H01R 12/7076* (2013.01); *H01R 4/027* (2013.01); *H01R 13/2442* (2013.01); *H01R 13/6585* (2013.01); *H05K 1/111* (2013.01)

(58) Field of Classification Search
CPC ................ H01R 12/7076; H01R 4/027; H01R 4/132422
USPC .......................................................... 439/66
See application file for complete search history.

(56) References Cited

U.S. PATENT DOCUMENTS

| | | | | |
|---|---|---|---|---|
| 6,206,707 B1 * | 3/2001 | Huang | ................. | H01R 23/688 439/108 |
| 6,428,358 B1 * | 8/2002 | Figueroa | ............ | H01R 13/6585 439/607.1 |
| 8,821,188 B2 * | 9/2014 | Chang | ................. | H01R 13/6586 439/607.01 |
| 8,932,080 B2 * | 1/2015 | Chang | ................. | H05K 7/1069 439/607.1 |
| 9,071,025 B2 * | 6/2015 | Uozumi | ............... | H01R 13/659 |
| 9,099,819 B2 * | 8/2015 | Hwang | ............. | H01R 12/7082 |
| 9,178,322 B2 * | 11/2015 | Chang | ................. | H01R 13/6594 |
| 9,225,121 B2 * | 12/2015 | Chang | ................. | H01R 13/6585 |
| 9,474,147 B2 * | 10/2016 | Masuda | ............... | H05K 1/0216 |
| 2003/0124879 A1 * | 7/2003 | Ng | ........................ | H01R 12/714 439/66 |
| 2009/0111325 A1 * | 4/2009 | Ju | ....................... | H01R 13/6599 439/607.55 |

* cited by examiner

*Primary Examiner* — Alexander Gilman
(74) *Attorney, Agent, or Firm* — Locke Lord LLP; Tim Tingkang Xia, Esq.

(57) ABSTRACT

An electrical connector for electrically conducting a chip module to a circuit board. At least one pad is disposed on the circuit board. The electrical connector includes an insulating body for sustaining the chip module, multiple signal terminals disposed in the insulating body and electrically conducting the chip module, and a first shielding sheet and a second shielding sheet respectively located on two adjacent sides of the signal terminals. The first shielding sheet and the second shielding sheet are connected to the same pad.

20 Claims, 8 Drawing Sheets

ELECTRICAL CONNECTOR

CROSS-REFERENCE TO RELATED APPLICATION

This non-provisional application claims priority to and benefit of, under 35 U.S.C. §119(a), Patent Application No. 201621184486.X filed in P.R. China on Oct. 28, 2016, the entire content of which is hereby incorporated by reference.

FIELD OF THE INVENTION

The present invention relates to an electrical connector, and more particularly to an electrical connector that electrically connects a chip module to a circuit board.

BACKGROUND OF THE INVENTION

In order to enable an existing central processing unit (CPU) to have stronger functions and a faster arithmetic speed, pin points of the CPU are increased more and more. In order to connect the CPU to a circuit board, an electrical connector is provided, which includes an insulating body, the insulating body is provided with multiple terminal slots corresponding to the pin points of the CPU, and multiple terminals are correspondingly contained in the multiple terminal slots. Therefore, the more the quantity of the pin points of the CPU is, the more the quantity of the corresponding terminals of the electrical connector is, so that distances among the signal terminals are closer and closer. In order to avoid mutual crosstalk of the adjacent signal terminals in a signal transmission process and improve signal transmission quality, people usually mount a plurality of shielding terminals among the multiple signal terminals and respectively solder them to a circuit board, so as to shield crosstalk among the signal terminals. However, each shielding terminal corresponds to one pad on the circuit board, various shielding terminals are independent of each other and are in different directions of the signal terminals, thus inevitably resulting in that the pads on the circuit board are excessive and too dense, and short circuit easily occurs during soldering. Besides, the pads are excessive, thus increasing difficulty of soldering, increasing the production cost of a product, and reducing the market competitiveness of the product.

Therefore, a heretofore unaddressed need exists in the art to address the aforementioned deficiencies and inadequacies.

SUMMARY OF THE INVENTION

In one aspect, the present invention relates to a chip module electrical connector that reduces the quantity of pads of a circuit board, and is capable of realizing high-speed and stable signal transmission.

In certain embodiments, an electrical connector is used for electrically conducting a chip module to a circuit board, where at least one pad is disposed on the circuit board. The electrical connector includes an insulating body for sustaining a chip module, multiple signal terminals received in the insulating body, and a first shielding sheet and a second shielding sheet respectively located on two adjacent sides of each signal terminal. The signal terminals electrically conduct the chip module. The first shielding sheet and the second shielding sheet are electrically connected to the same pad. The first shielding sheet, the second shielding sheet are molded separately.

In certain embodiments, the first shielding sheet and the second shielding sheet respectively have a first conducting portion and a second conducting portion extending out of a bottom surface of the insulating body and being soldered to the pad.

In certain embodiments, the first conducting portion and the second conducting portion fix a same tin ball, and are soldered to the pad through the tin ball.

In certain embodiments, one side of the first conducting portion is recessed to form a first groove, one side of the second conducting portion is recessed to form a second groove, and the first groove and the second groove jointly clamp a same tin ball.

In certain embodiments, the first conducting portion extends in a direction opposite to the first groove to form a clamp hook to clamp upward the insulating body.

In certain embodiments, the first shielding sheet has a first base, two ends of the first base extend downward to respectively form a first conducting portion, the first conducting portions are soldered to different pads. The base further extends downward to form a first retaining portion, and the first retaining portion is located between the two first conducting portions.

In certain embodiments, the first base extend upward to form a connecting portion, a width of the connecting portion is smaller than a width of the first base. One side of the connecting portion is flush with one side of the first base, and the other side of the connecting portion bends and extends along a tail end in a horizontal direction to form a protrusion portion. The protrusion portion is limited downward by the insulating body.

In certain embodiments, the protrusion portion is formed by bending and extending from the connecting portion toward the signal terminal and then bending and extending away from the signal terminal.

In certain embodiments, one end of the protrusion portion bends and extends upward to form a mating portion. The mating portion extends out of an upper surface of the insulating body and elastically contacts the chip module. The signal terminal has a spring arm conducting the chip module. The shape of the spring arm is the same as that of the urging portion.

In certain embodiments, the signal terminal has a soldering arm soldered to the circuit board, the at least one second shielding sheet has a tail portion soldered to the circuit board, a shape of the soldering arm is the same as that of the tail portion, and the at least one second shielding sheet doesn't contact the chip module.

In certain embodiments, the at least one second shielding sheet has a second base retained in the insulating body, the second base is in a flat plate shape, a gap exists between an upper edge of the second base and the chip module, two ends of the second base extend downward to respectively form a second conducting portion soldered to different pads, the second base also extends downward to form two tail portions soldered to the circuit board, and the two tail portions are located between the two second conducting portions.

In certain embodiments, each of the tail portions forks into two branches, the insulating body is provided with a protruding block, and the two branches and the protruding block jointly clamp a tin ball.

In certain embodiments, the second base further extends downward to form a second retaining portion embedded in the insulating body. The second retaining portion is located between the two tail portions, and the length of the second retaining portion is smaller than the lengths of the second conducting portions.

In certain embodiments, the electrical connector has two first shielding sheets and one second shielding sheet which are crossly disposed, are in T-shaped arrangement, and jointly clamp a same tin ball to be soldered to the pad.

In certain embodiments, the electrical connector has two first shielding sheets and two second shielding sheets which are crossly disposed, are in crossing-shaped arrangement, and jointly clamp a same tin ball to be soldered to the pad.

In certain embodiments, the electrical connector has multiple tin balls which are disposed in multiple rows. Viewing from a direction vertical to the second shielding sheet, the number of the tin balls in each odd row is greater than the number of the tin balls in each even row.

In certain embodiments, the electrical connector includes two signal terminals, two first shielding sheets are respectively located on two opposite sides of the two signal terminals, and two second shielding sheets are respectively located on the other two sides of the two signal terminals, so that the two first shielding sheets and the two second shielding sheets surround the two signal terminals.

In certain embodiments, the two signal terminals and the two first shielding sheets are in four-row arrangement, and the two signal terminals and the two second shielding sheets are in three-row arrangement.

In certain embodiments, the electrical connector includes two first shielding sheets and two second shielding sheets. Each of the first shielding sheets and each of the second shielding sheets respectively have a first conducting portion and a second conducting portion passing through the insulating body. The two first conducting portions and the two second conducting portions form an accommodating area to contain a tin ball. The bottom surface of the insulating body protrudes and extends downward to form a protruding block. The protruding block is adjacent to the accommodating area. Each of the second shielding sheets further extends downward to form a tail portion. The tail portion passes through the insulating body, and clamps another tin pall together with the protruding block.

In certain embodiments, the at least one first shielding sheet has an urging portion, the urging portion extends out of an upper surface of the insulating body and elastically contacts the chip module, the signal terminal has a spring arm contacting the chip module, a shape of the spring arm is the same as that of the urging portion, and the at least one second shielding sheet doesn't contact the chip module.

Compared with the related art, certain embodiments of the present invention have the following beneficial advantages. The adjacent first shielding sheet and second shielding sheet are jointly connected to the same pad, thus not only realizing effective grounding of the first shielding sheet and the second shielding sheet, guaranteeing a good shielding function, and ensuring the stability of high-speed signal transmission of the signal terminal, but also obviously reducing the quantity of the pads on the circuit board, enabling various pads on the circuit board to be spaced enough, and reducing the risk that adjacent terminals are short-circuited during soldering. Further, the reduction of the quantity of the pads reduces soldering difficulty, saves production cost of a product, and improves the market competitiveness of the product.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
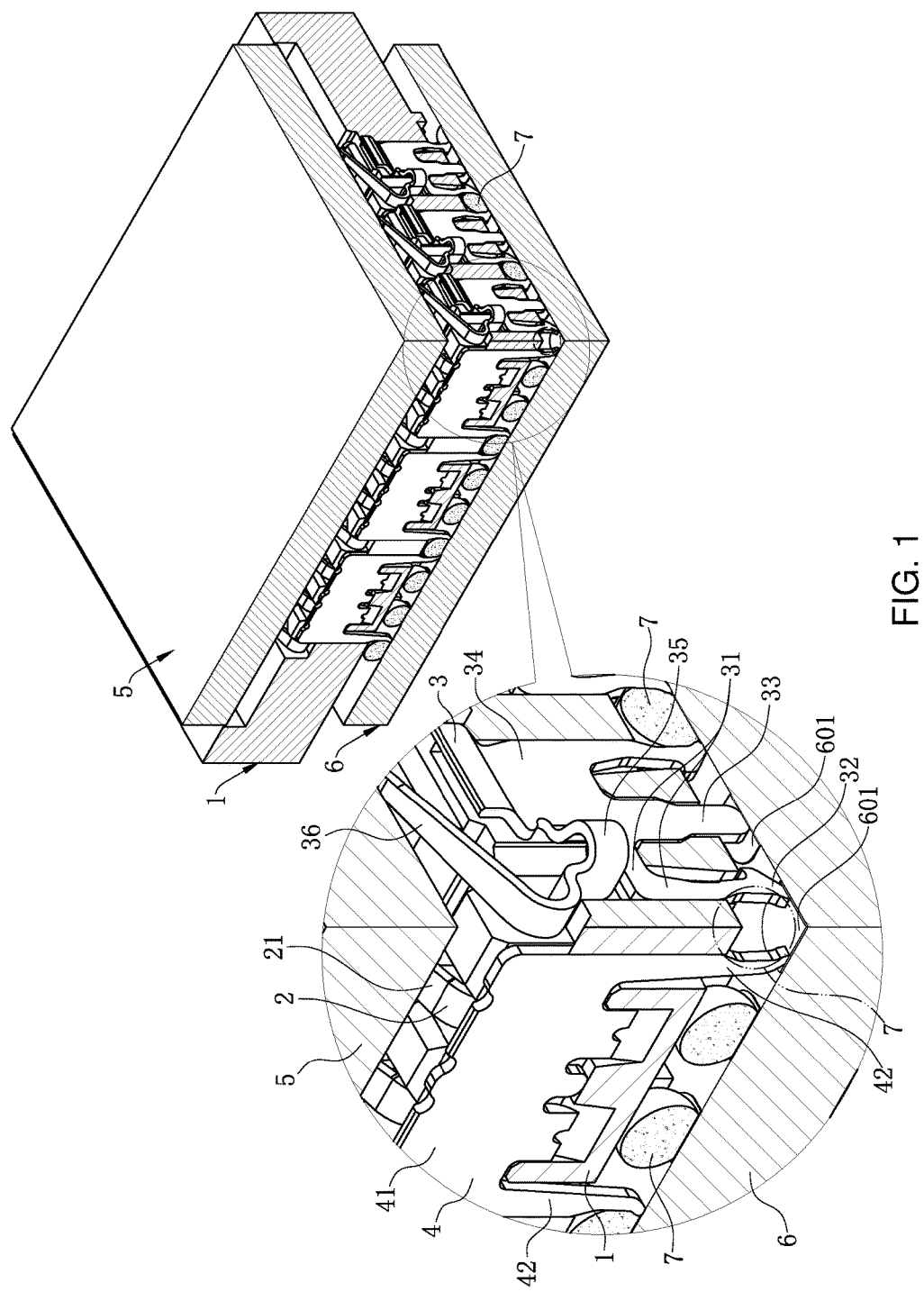
FIG. 1 is a schematic three-dimensional sectional view when an electrical connector according to one embodiment of the present invention connects a chip module to a circuit board.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-8. In accordance with the purposes of this invention, as embodied and broadly described herein, this invention, in one aspect, relates to an electrical connector.

Figure 8:
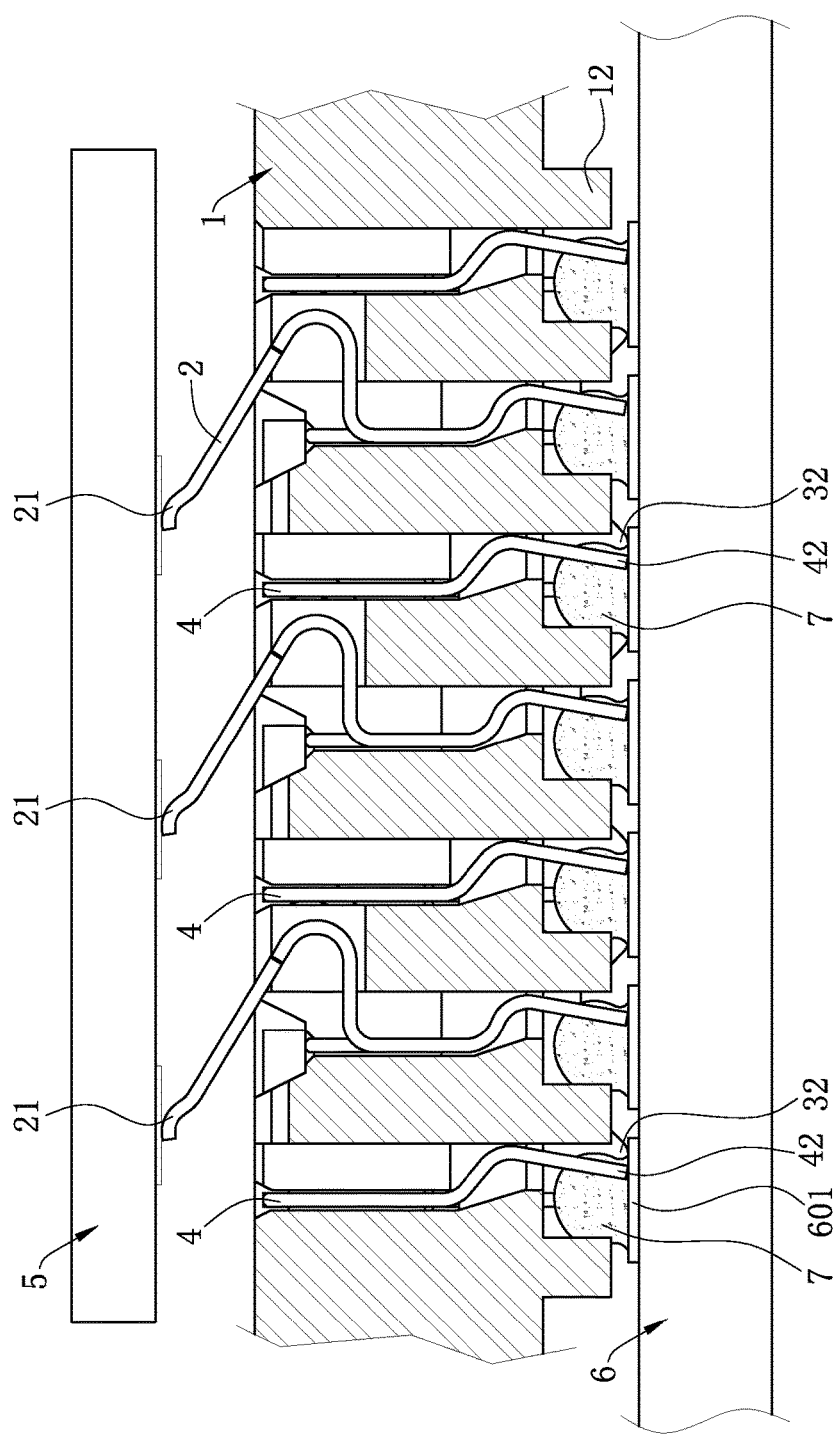
FIG. 8 is a sectional view of an electrical connector according to one embodiment of the present invention when a signal terminal urges against the chip module.

As shown in FIG. 1 and FIG. 8, an electrical connector according to one embodiment of the present invention is an LGA packaged array electrical connector 100, and is used for electrically connecting a chip module 5 to a circuit board 6. The electrical connector 100 includes an insulating body 1, multiple signal terminals 2, multiple first shielding sheets 3, and multiple second shielding sheets 4. The insulating body 1 is provided with multiple receiving slots 11 for accommodating the multiple signal terminals 2. The multiple signal terminals 2 communicate the chip module 5 to the circuit board 6. The multiple first shielding sheets 3 and multiple second shielding sheets 4 are disposed on the periphery of the signal terminals 2, are contained in the receiving slots 11, and are soldered to the circuit board 6.

Figure 5:
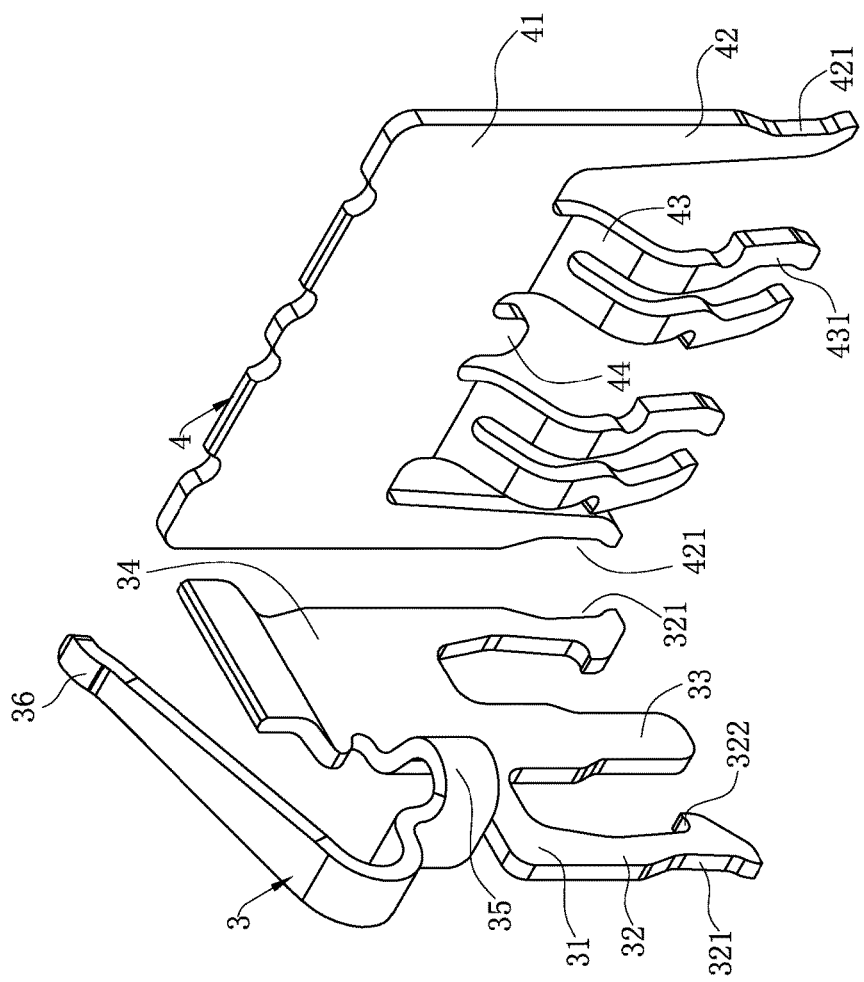
FIG. 5 is a schematic three-dimensional view of a first shielding sheet and a second shielding sheet in the electrical connector according to one embodiment of the present invention.

As shown in FIG. 1 and FIG. 5, each of the first shielding sheets 3 has a first base 31. Two ends of the first base 31 extend downward to respectively form a first conducting portion 32. The middle of the first base 31 extends downward to form a first retaining portion 33. The two first conducting portions 32 and the retaining portion 33 pass through the insulating body 1, and the first retaining portion 33 is located between the two first conducting portions 32. In the present embodiment, each of the first conducting portions 32 is soldered to a pad 601 on the circuit board 6 through a tin ball 7, and the first retaining portion 33 is directly soldered to another pad 601. In other embodiments, a connecting mode between the first shielding sheet 3 and the circuit board 6 is not limited, as long as stable communication between the first shielding sheet 3 and the circuit board 6 is ensured and the first shielding sheet 3 is grounded. One side of each of the first conducting portions 32 is recessed to form a first groove 321. The tail end of each of the first conducting portions 32 extends to a direction far from the groove 321 to form a clamp hook 322. The clamp hook 322 clamps upward against the insulating body 1, and prevents the first shielding sheet 3 from moving upward from the insulating body 1.

Figure 6:
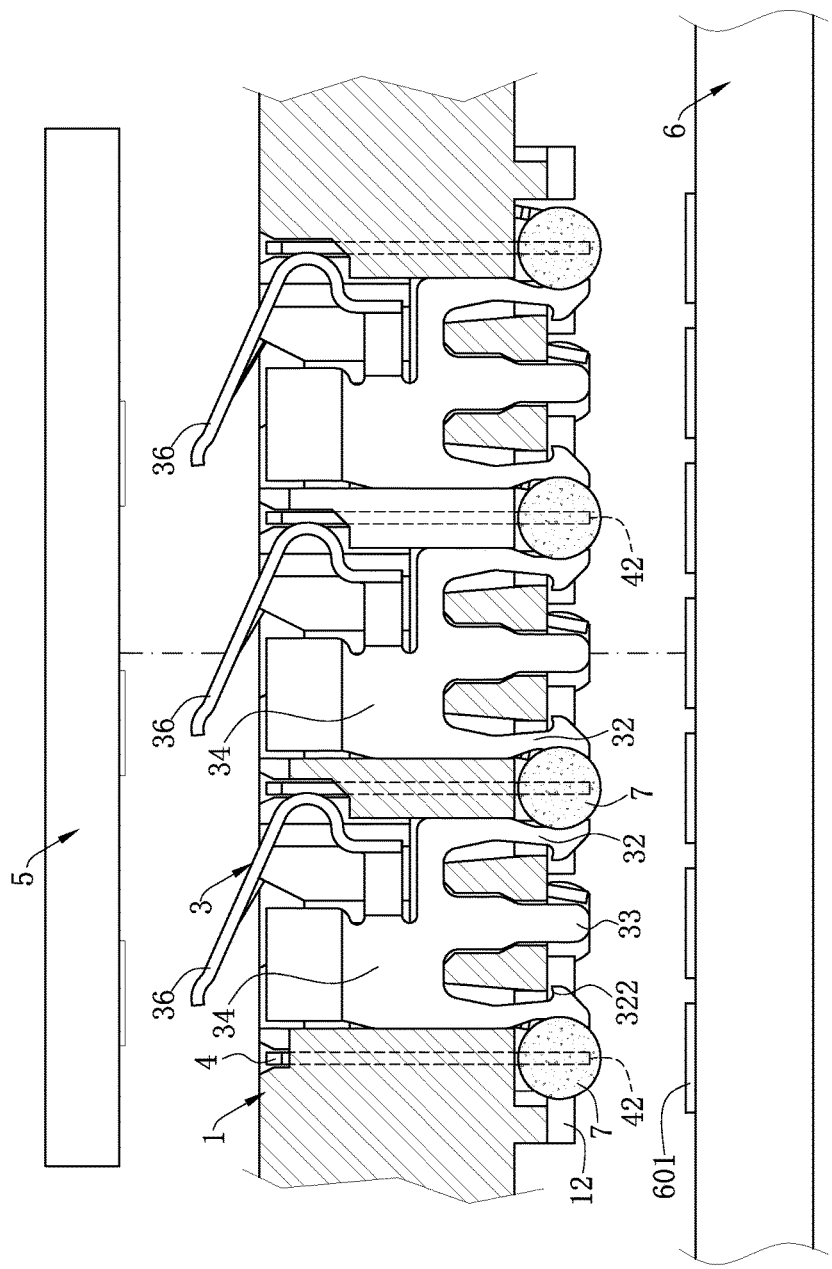
FIG. 6 is a sectional view of an electrical connector according to one embodiment of the present invention before mounting a chip module and a circuit board.
Figure 7:
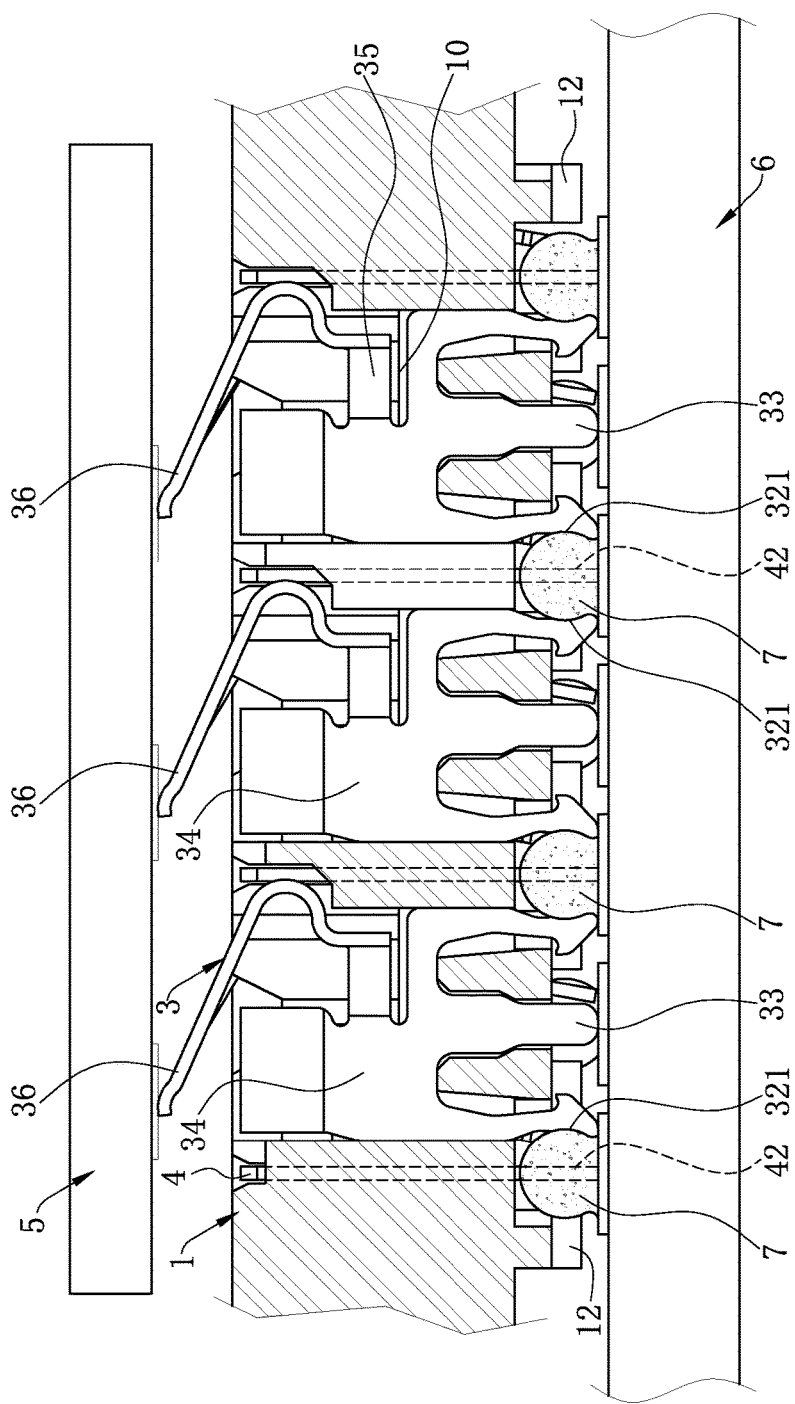
FIG. 7 is a sectional view of an electrical connector according to one embodiment of the present invention when the first shielding sheet urges against the chip module.

As shown in FIGS. 5-7, the first base 31 extends upward to form a connecting portion 34. The width of the connecting portion 34 is smaller than the width of the first base 31. One side of the connecting portion 34 is flush with one side edge of the first base 31, and the other side of the connecting portion 34 bends and extends along a horizontal direction to form a protrusion portion 35. The protrusion portion 35 urges downward against a stopping surface 10 of the insulating body 1, and prevents the first shielding sheet 3 from moving downward under a pressure of the chip module 5. In the present embodiment, the protrusion portion 35 is formed by bending and extending from the connecting portion 34 toward the signal terminal 2 and then bending and extending away from the signal terminal 2. In other embodiments, the protrusion portion 35 only needs to be enabled to stably urge downward against the insulating body 1, and the shape of the protrusion portion 35 is not limited herein. One end of the protrusion portion 35 bends and extends upward to form an urging portion 36 elastically urging against the chip module 5, so that a grounding contact of the chip module 5 is grounded through the first shielding sheet 3. The signal terminal 2 has a spring arm 21 elastically pressing the chip module 5 and a soldering arm 22 soldered to the circuit board 6. The urging portion 36 and the spring arm 21 are the same in shape, and stress uniformity of the chip module 5 is ensured.

The second shielding sheet 4 has a second base 41 retained in the insulating body 1. The second base 41 is in a shape of a flat plate, and a gap exists between the upper edge of the second base 41 and the chip module 5, so that the second shielding sheet 4 doesn't urge the chip module 5, the chip module 5 bears too much pressure when being mounted is avoided, and the risk that the chip module 5 is damaged is lowered. Two ends of the second base 41 extend downward to respectively form a second conducting portion 42. The two second conducting portions 42 are soldered to different pads 601. The second base 41 further extends downward to form two tail portions 43. The bottom surface of the insulating body 1 is provided with protruding blocks 12 corresponding to the positions of the tail portions 43. The tail portions 43 and one corresponding protruding block 12 jointly clamp one tin ball 7, so that the tail portions 43 are soldered to the circuit board 6. The two tail portions 43 are located between the two second conducting portions 42. In the present embodiment, the tail end of each of the tail portions 43 forks into two branches 431. The two branches 431 and one protruding block 12 clamp one tin ball 7, so that the tail portions 43 are soldered to the circuit board 6. The second base 44 further extends downward to form a second retaining portion 44. The second retaining portion 44 is located between the two tail portions 43. The length of the second retaining portion is smaller than the lengths of the second conducting portions 42, so that the second retaining portion 44 can be embedded in the insulating body 1, and the second shielding sheet 4 is prevented from loosening in the insulating body 1. One side of each of the second conducting portions 42 is recessed to form a second groove 421 jointly accommodating the tin ball 7 with the first groove 321.

Figure 4:
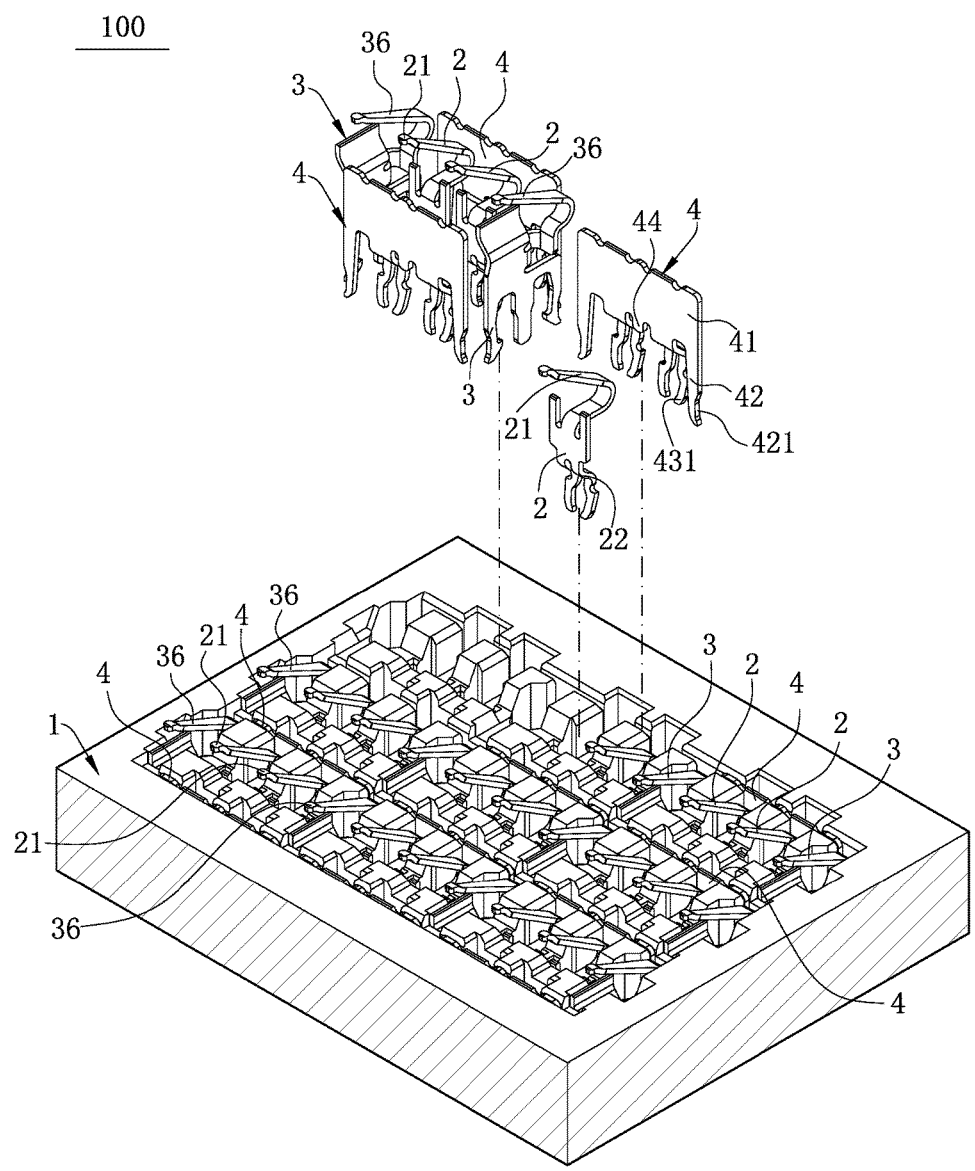
FIG. 4 is a part of a three-dimensional exploded view of an electrical connector according to one embodiment of the present invention viewed from another angle.

As shown in FIG. 4, the two first shielding sheets 3 are disposed on two opposite sides of the two signal terminals 2 in parallel, and the two second shielding sheets 4 are disposed on the other two sides of the two signal terminals 2 in parallel, so that the two first shielding sheets 3 and the two second shielding sheets 4 surround the two signal terminals 2 to enhance a shielding effect. Further, the adjacent first shielding sheet 3 and second shielding sheet 4 are perpendicular to each other. In the present embodiment, the two adjacent signal terminals 2 form a high-speed signal terminal pair, so as to meet the need of high-speed signal transmission. Conductive terminals in the electrical connector of the invention are arranged in matrix, where the two first shielding sheets 3 and the two second shielding sheets 4 surrounding a pair of the signal terminals 2 are taken as a minimum unit. In other embodiments, the specific number of the terminals 2 can be freely assigned according to actual needs.

Figure 2:
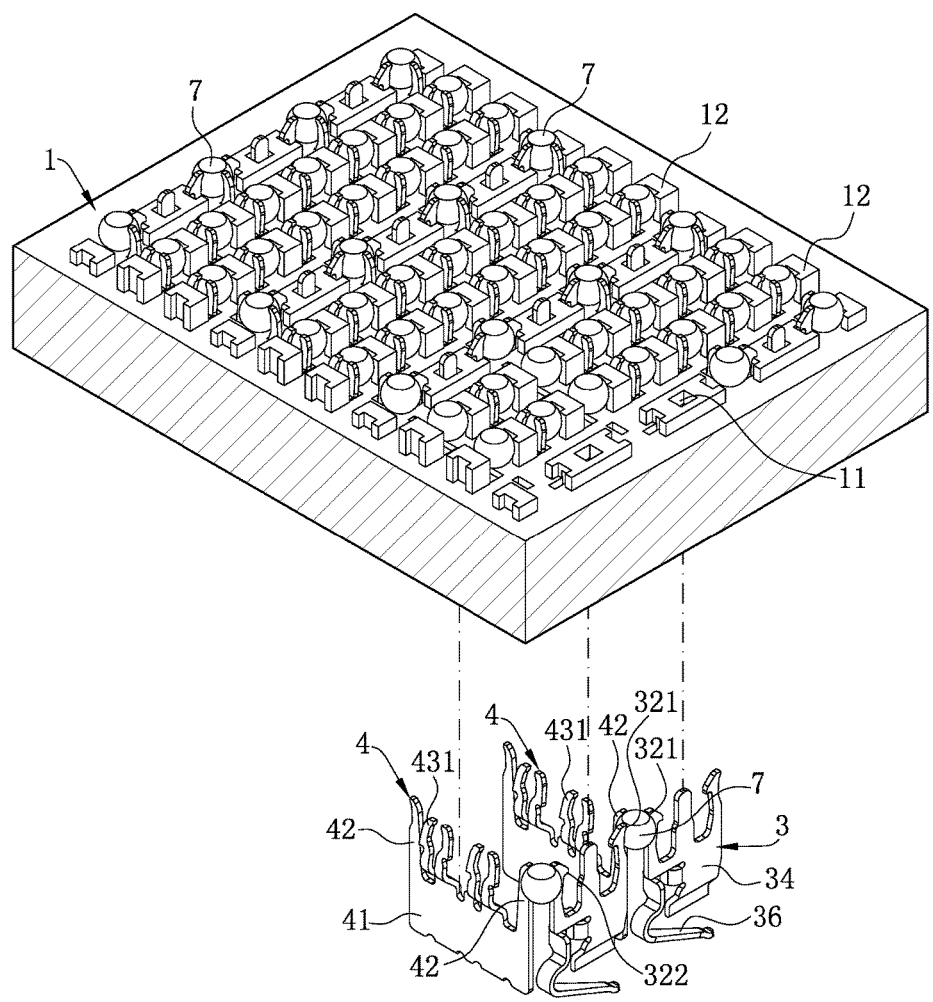
FIG. 2 is a schematic three-dimensional view of an electrical connector according to one embodiment of the present invention before assembling part of shielding sheets at edge of the electrical connector.

As shown in FIG. 1 and FIG. 2, the adjacent first conducting portion 32 and second conducting portion 42 located at four corners of a matrix jointly clamp one tin ball 7, and are soldered to the same pad 601 of the circuit board 6.

As shown in FIG. 2, the two first shielding sheets 3 and the one second shielding sheet 4, which are located on one side of the matrix and are adjacent, are in T-shaped arrangement, so that the two first conducting portions 32 and the one second conducting portion 42 jointly clamp the one tin ball 7 to be soldered to the same pad 601 of the circuit board 6.

Figure 3:
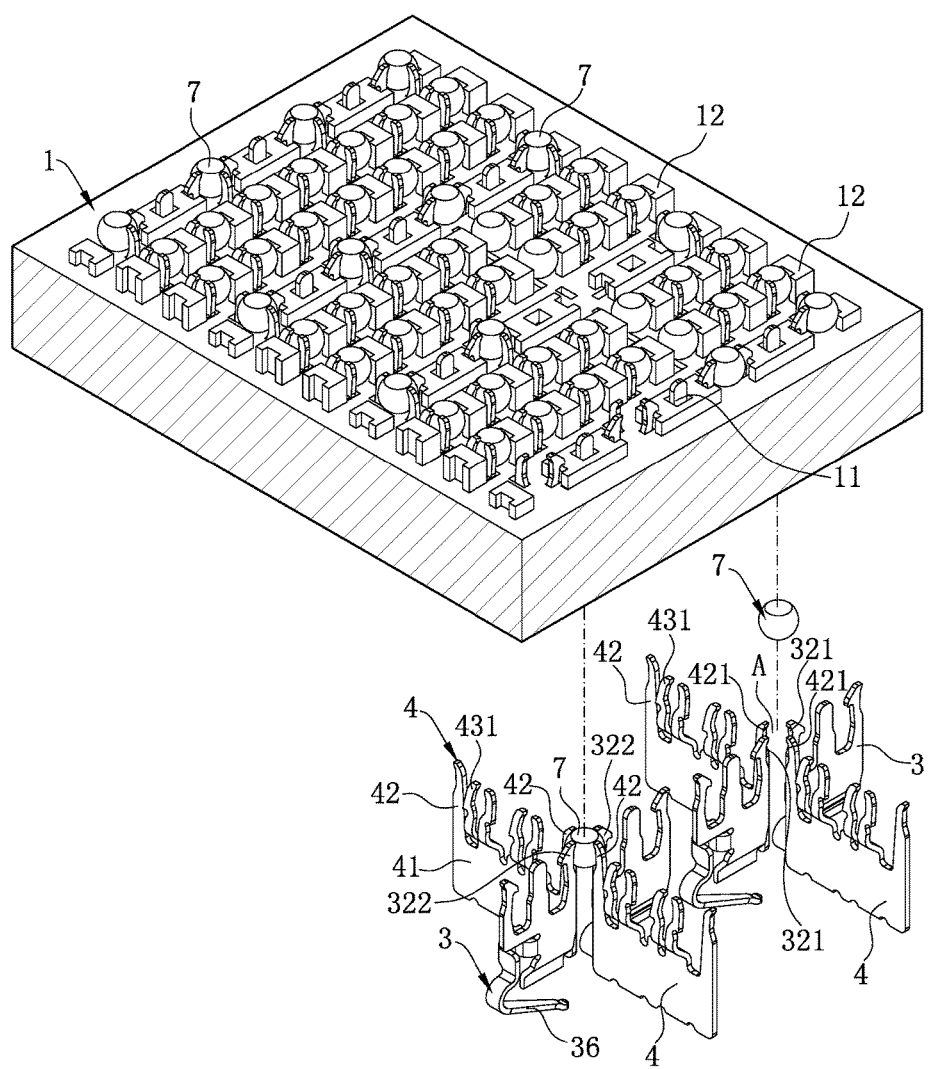
FIG. 3 is a schematic three-dimensional view of an electrical connector according to one embodiment of the present invention before assembling shielding sheets at the middle part of the electrical connector.

As shown in FIG. 3, the two first shielding sheets 3 and the two second shielding sheets 4, which are located inside the matrix and are adjacent, are in crossing arrangement, so that the two first conducting portions 32 and the two second conducting portions 42 form an accommodating area A for containing the corresponding one tin ball 7 to be soldered to the same pad 601 of the circuit board 6.

In summary, the electrical connector 100 according to certain embodiments of the present invention has the following beneficial advantages:

(1) At least one of the first conducting portion 32 and the second conducting portion 42 are soldered to the same pad 601, so that each shielding sheet corresponds to one pad 601 is avoided. This not only meets the need of shielding crosstalk, but also reduces the quantity of the pads 601 needed by the circuit board 6, such that all pads 601 on the circuit board 6 are spaced enough, the risk that adjacent terminals are short-circuited during welding is lowered, and the product production cost is saved.

(2) The first shielding sheets 3 urge against the chip module 5, and the second shielding sheets 4 don't urge against the chip module 5, thus not only the need of grounding the chip module 5 is met, but also damaging of the chip module 5 due to too much urging force is avoided.

(3) The first groove 321 and the second grooves 421 jointly clamp the same tin ball 7, thus increasing clamping stability of the tin ball 7, and ensuring welding accuracy.

(4) The urging portion 36 and the spring arm 21 are the same in shape, and stress uniformity of the chip module 5 is ensured.

(5) The first retaining portion 33 is directly soldered to the circuit board, multi-point grounding of the first shielding sheet 3 and the circuit board 6 is ensured, and the shielding effect is enhanced.

(6) The tail portions 43 and the protruding block 12 jointly clamp the same tin ball 7 to be soldered to the circuit board 6, and multi-point grounding of the second shielding sheet 4 is ensured.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically conducting a chip module to a circuit board, the circuit board having at least one pad, and the electrical connector comprises:
    an insulating body for sustaining the chip module;
    a plurality of signal terminals, disposed in the insulating body, and electrically conducting the chip module; and
    at least one first shielding sheet and at least one second shielding sheet respectively located on two adjacent sides of the signal terminals,
    wherein the at least one first shielding sheet and the at least one second shielding sheet are electrically connected to the same at least one pad, and the at least one first shielding sheet and the at least one second shielding sheet are molded separately, and
    wherein the at least one first shielding sheet and the at least one second shielding sheet respectively have a first conducting portion and a second conducting portion extending out of a bottom surface of the insulating body and soldered to the at least one pad, the first conducting portion and the second conducting portion fix a tin ball, and are soldered to the at least one pad through the tin ball.

2. The electrical connector of claim 1, wherein one side of the first conducting portion is recessed to form a first groove, one side of the second conducting portion is recessed to form a second groove, and the first groove and the second groove jointly clamp the tin ball.

3. The electrical connector of claim 2, wherein the other side, opposite to the first groove, of the first conducting portion is provided with a clamp hook to clamp upward the insulating body.

4. The electrical connector of claim 1, wherein the signal terminal has a soldering arm soldered to the circuit board, the at least one second shielding sheet has a tail portion soldered to the circuit board, a shape of the soldering arm is the same as that of the tail portion, and the at least one second shielding sheet doesn't contact the chip module.

5. The electrical connector of claim 1, wherein the at least one second shielding sheet has a second base retained in the insulating body, the second base is in a flat plate shape, a gap exists between an upper edge of the second base and the chip module, each of two ends of the second base extends downward to form a second conducting portion, the two second conducting portions are soldered to different pads, the second base also extends downward to form two tail portions soldered to the circuit board, and the two tail portions are located between the two second conducting portions.

6. The electrical connector of claim 5, wherein each of the tail portions forks into two branches, the insulating body is provided with a protruding block, and the two branches and the protruding block jointly clamp a tin ball.

7. The electrical connector of claim 5, wherein the second base further extends downward to form a second retaining portion embedded in the insulating body, the second retaining portion is located between the two tail portions, and a length of the second retaining portion is smaller than a lengths of the second conducting portions.

8. The electrical connector of claim 1, wherein the plurality of signal terminals comprise two signal terminals, the at least one first shielding sheet comprises two first shielding sheets, the at least one second shielding sheet comprises two second shielding sheets, the two first shielding sheets are respectively located on two opposite sides of the two signal terminals, and the two second shielding sheets are respectively located on the other two sides of the two signal terminals, such that the two first shielding sheets and the two second shielding sheets surround the two signal terminals.

9. The electrical connector of claim 8, wherein the two signal terminals and the two first shielding sheets are in four-row arrangement, and the two signal terminals and the two second shielding sheets are in three-row arrangement.

10. The electrical connector of claim 1, wherein the at least one first shielding sheet comprises two first shielding sheets, the at least one second shielding sheet comprises two second shielding sheets, each of the first shielding sheets and the second shielding sheets respectively have a first conducting portion and a second conducting portion passing through the insulating body, the two first conducting portions and the two second conducting portions form an accommodating area to contain a tin ball, a bottom surface of the insulating body protrudes and extends downward to form a protruding block, the protruding block is adjacent to the accommodating area, each of the second shielding sheets further extends downward to form a tail portion, and each of the tail portions passes through the insulating body, and clamps another tin pall together with the protruding block.

11. The electrical connector of claim 1, wherein the at least one first shielding sheet has an urging portion, the urging portion extends out of an upper surface of the insulating body and elastically contacts the chip module, the signal terminal has a spring arm contacting the chip module, a shape of the spring arm is the same as that of the urging portion, and the at least one second shielding sheet doesn't contact the chip module.

12. An electrical connector for electrically conducting a chip module to a circuit board, the circuit board having at least one pad, and the electrical connector comprises:
a insulating body for sustaining the chip module;
a plurality of signal terminals, disposed in the insulating body, and electrically conducting the chip module; and
at least one first shielding sheet and at least one second shielding sheet respectively located on two adjacent sides of the signal terminals,
wherein the at least one first shielding sheet and the at least one second shielding sheet are electrically connected to the same at least one pad, and the at least one first shielding sheet and the at least one second shielding sheet are molded separately, and
wherein the at least one first shielding sheet has a first base, each of two ends of the first base extends downward to form a first conducting portion, the two first conducting portions are soldered to different pads, the base also extends downward to form a first retaining portion passing through the insulating body, and the retaining portion is located between the two first conducting portions.

13. The electrical connector of claim 12, wherein the first base extends upward to form a connecting portion, a width of the connecting portion is smaller than a width of the first base, one side of the connecting portion is flush with one side of the first base, and the other side of the connecting portion bends and extends along a horizontal direction to form a protrusion portion, and the protrusion portion is limited downward by the insulating body.

14. The electrical connector of claim 7, wherein the protrusion portion is formed by bending and extending from the connecting portion toward the signal terminals and then bending and extending away from the signal terminals.

15. The electrical connector of claim 7, wherein one end of the protrusion portion bends and extends upward to form an urging portion, the urging portion extends out of an upper surface of the insulating body and elastically contacts the chip module, the signal terminal has a spring arm conducting the chip module, and a shape of the spring arm is the same as that of the urging portion.

16. The electrical connector of claim 12, wherein the at least one first shielding sheet has an urging portion, the urging portion extends out of an upper surface of the insulating body and elastically contacts the chip module, the signal terminal has a spring arm contacting the chip module, a shape of the spring arm is the same as that of the urging portion, and the at least one second shielding sheet doesn't contact the chip module.

17. An electrical connector for electrically conducting a chip module to a circuit board, the circuit board having at least one pad, and the electrical connector comprises:
an insulating body for sustaining the chip module;
a plurality of signal terminals, disposed in the insulating body, and electrically conducting the chip module; and
at least one first shielding sheet and at least one second shielding sheet respectively located on two adjacent sides of the signal terminals,
wherein the at least one first shielding sheet and the at least one second shielding sheet are electrically connected to the same at least one pad, and the at least one first shielding sheet and the at least one second shielding sheet are molded separately, and
wherein the at least one first shielding sheet comprises two first shielding sheets, the at least one second shielding sheet comprises one second shielding sheet, the two first shielding sheets and the one second shielding sheet are crossly disposed and arranged in a shape of T, and jointly clamp a same tin ball to be soldered to the at least one pad.

18. The electrical connector of claim 1, wherein the at least one first shielding sheet comprises two first shielding sheets, the at least one second shielding sheet comprises two second shielding sheet, the two first shielding sheets and the two second shielding sheets are crossly disposed and jointly clamp a same tin ball to be soldered to the at least one pad.

19. The electrical connector of claim 17, wherein the signal terminal has a soldering arm soldered to the circuit board, the at least one second shielding sheet has a tail portion soldered to the circuit board, a shape of the soldering arm is the same as that of the tail portion, and the at least one second shielding sheet doesn't contact the chip module.

20. The electrical connector of claim 17, wherein the at least one first shielding sheet has an urging portion, the urging portion extends out of an upper surface of the insulating body and elastically contacts the chip module, the signal terminal has a spring arm contacting the chip module, a shape of the spring arm is the same as that of the urging portion, and the at least one second shielding sheet doesn't contact the chip module.

* * * * *